(12) United States Patent
Takahashi et al.

(10) Patent No.: US 6,986,467 B2
(45) Date of Patent: Jan. 17, 2006

(54) IC CARD

(75) Inventors: Hideki Takahashi, Tokyo (JP); Kimi Ojima, Tachikawa (JP)

(73) Assignee: Konica Corporation, (JP)

( * ) Notice: Subject to any disclaimer, the term of this patent is extended or adjusted under 35 U.S.C. 154(b) by 122 days.

(21) Appl. No.: 10/428,453

(22) Filed: May 2, 2003

(65) Prior Publication Data

US 2003/0214794 A1    Nov. 20, 2003

(30) Foreign Application Priority Data

May 10, 2002  (JP) .............................. 2002-134909

(51) Int. Cl.
    *G06K 19/06*   (2006.01)
(52) U.S. Cl. ..................... 235/492; 235/487
(58) Field of Classification Search ............... 235/380, 235/487–494; 438/106–115, 460, 464, 458; 361/737
    See application file for complete search history.

(56) References Cited

U.S. PATENT DOCUMENTS

| | | | | |
|---|---|---|---|---|
| 4,055,833 A | * | 10/1977 | Rothfjell | 382/118 |
| 5,497,297 A | * | 3/1996 | Kilmer et al. | 361/737 |
| 5,574,628 A | * | 11/1996 | Persia et al. | 361/737 |
| 6,160,711 A | * | 12/2000 | Gerrits et al. | 361/737 |
| 6,297,075 B1 | * | 10/2001 | Odajima et al. | 438/110 |

* cited by examiner

*Primary Examiner*—Diane I. Lee
*Assistant Examiner*—Kumiko C. Koyama
(74) *Attorney, Agent, or Firm*—Cantor Colburn LLP

(57) ABSTRACT

An IC card includes a first support; a second support; an IC module including an IC chip, a reinforcing structural member neighboring to the IC chip and an antenna; the IC module providing between the first and second supports; a first adhesive layer provided between the first support and the IC chip; and a second adhesive layer provided between the first support and the IC chip. The IC card has a rebound coefficient (h/h0) of 0.52 to 0.70, where h0 is a dropping height from which a steel ball is dropped onto the IC card and h is a rebound height to which the steel ball rebounds from the IC card.

19 Claims, 9 Drawing Sheets

IC CARD

BACKGROUND OF THE INVENTION

The present invention relates to a non-contact-type electronic card which records personal information requiring security with respect to prevention of such as forgery or alternation, or a personal certification card that is suitably applied to a sheet.

As an identification card (ID card) or a credit card, a magnetic card which records data by means of a conventional magnetic recording method has been commonly utilized. However, a magnetic card had problems of insufficient anti-tampering with data due to the ease of rewriting of the data, of insufficient protection of data due to environmental susceptibility of magnetic record and of insufficient memory capacity.

Therefore, an IC card including an IC-tip has become popular in recent years. An IC card exchanges data with external equipment by reading and writing, through an electric connection provided on the surface or a loop antenna in the card. An IC card is provided with larger memory capacity compared to a magnetic card and has been significantly improved also in security. Particularly, a noncontact-type IC card, which is provided with an antenna inside the card and without having an electric connection outside the card, is superior in security compared to a contact-type IC card which has an electric connection on the card surface, and has become to be utilized in such application as an IC card which highly requires secrecy and prevention of forgery or alternation.

As such an IC card, for example, there is known a card in which the first sheet material and the second sheet material are laminated sandwiching an adhesive and an IC module including an IC-tip and an antenna are sealed in the adhesive layer.

Since an IC card requires high security, durability of an IC card has become important in respect to prevention of forgery or alternation. Particularly, since an electric part such as an antenna for information exchange between an IC-tip and the outside are included inside the card, various attempts to assure durability thereof has been performed. However, in accordance with becoming popular in various applications, further high durability has been required. Owing to characteristics of a card that may be usually carried, strong durability is required against repeated bending such as in a pocket of trousers, dropping, or pressure by such as coins. To satisfy such requirements, improvement such as to provide a strong reinforcement structure in an IC-tip has been proposed.

However, although a limited improvement of durability was observed, there caused problems in that sufficient durability was not obtained in various situations, for example, in respect to such as durability against impact with rapid stress, repeated bending durability with repeated stress, and repeated localized load, resulting in a break of an IC-tip or a break of a card to make electric operation impossible. Further, in addition to improve the durability; to describe personal information, a smooth surface property so as to produce no density variation or no scratches in such as sublimation print and fused marking; are required.

SUMMARY OF THE INVENTION

The object of the invention is to provide an IC card that is possible to improve such durability as well as to improve a surface property in higher dimensions.

To solve the above-described problems and to achieve the object, the invention has been constituted as follows.

The invention described in item 1 is an IC card, provided with a part including an IC module comprised of an IC-tip, a reinforcement structure adjacent to the IC-tip and an antenna at a predetermined position between two supports facing to each other via an adhesive, characterized in that a rebound coefficient (h/h0) is from 0.52 to 0.70, wherein a dropping height is h0 and a rebound height is h when a rigid ball (a steel ball) is dropped against the said IC card.

According to the invention described in item 1, it is possible to improve impact strength of an IC card and to protect a part including an IC module, by defining a rebound coefficient of an IC card.

The invention described in item 2 is an IC card, provided with a part including an IC module comprised of an IC-tip, a reinforcement structure adjacent to the IC-tip and an antenna, at a predetermined position between two supports facing to each other via an adhesive, characterized in that the first support/an adhesive/an IC-module/an adhesive/the second support are accumulated in this order from the outermost layer of the card, 2% modules of elasticity of the said adhesive is not less than 5 kg/mm$^2$ and not more than 55 kg/mm$^2$, an occupying ratio of the total thickness of the said first and second supports in a card thickness is not less than 0.33 and not more than 0.55, and an occupying thickness of the said IC-tip in the total thickness of the said first and second supports is not less than 0.05 and not more than 0.40.

According to the invention described in item 2, it is possible to improve impact strength of an IC card and to protect a part including an IC module as well as to improve durability and to improve a surface property in higher dimensions, by defining a thickness and a layer configuration of an IC card in addition to elasticity of an adhesive.

The invention described in item 3 is an IC card described in item 1 or item 2, characterized in that the said reinforcement structure is a metal plate brought in cross contact with the non-circuit surface of the said IC-tip via an adhesive.

According to the invention described in item 3, it is possible to protect a part including an IC module by constituting a reinforcement structure of a metal plate.

The invention described in item 4 is an IC card described in any one of items 1 to 3, characterized in that the said adhesive is provided directly adjacent to at least a part of an IC-tip.

According to the invention described in item 4, it is possible to relax stress loaded on an IC-tip and to improve durability by providing an adhesive directly adjacent to a part of an IC-tip.

The invention described in item 5 is an IC card described in any one of items 1 to 4, characterized in that at least one of the said two supports facing to each other is provided with an image receiving layer on which personal identification information comprised of a name and a face image is provided and the other is provided with a writable writing layer.

According to the invention described in item 5, the IC card is possible to be applied to a non-contact-type electronic card or a sheet, which is provided with an image receiving layer and a writing layer and memorizes such as personal information requiring security with respect to prevention of forgery or alternation, and to be utilized as a suitable personal identification card.

The invention described in item 6 is an IC card described in any one of items 1 to 5, characterized in that the said adhesive is a reactive-type hot-melt adhesive.

According to the invention described in item 6, it is possible to relax stress and to obtain high durability due to an adhesive being a reactive-type hot-melt adhesive.

DETAILED DESCRIPTION OF THE PREFERRED EMBODIMENT

Figure 1:
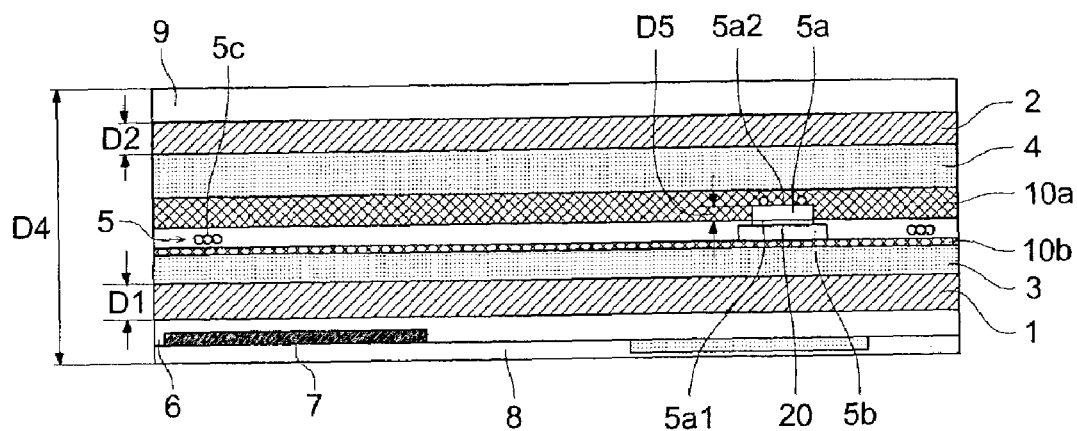
FIG. 1 shows a schematic layer configuration of an IC card.
Figure 2:
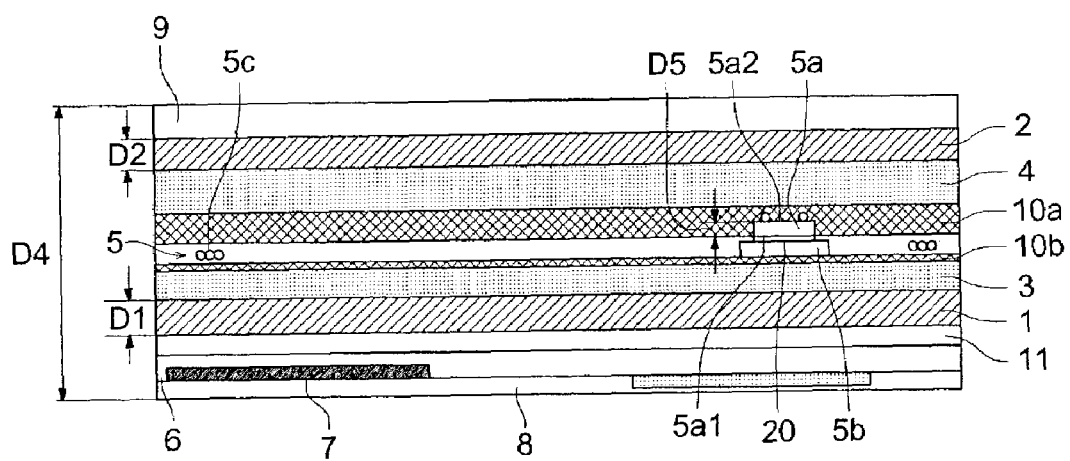
FIG. 2 shows a schematic layer configuration of another embodiment of an IC card.

In what follows, the embodiments of an IC card of the invention will be detailed according to drawings, however the invention is not limited to the embodiments. FIG. 1 is a drawing showing a brief layer configuration of an IC card, and FIG. 2 is a drawing showing a brief layer configuration in another embodiment of an IC card.

An IC card of the invention is provided with a part including IC module 5; comprised of IC-tip 5a, reinforcement structure 5b adjacent to IC-tip 5a, and antenna 5c; at a predetermined position between the two supports, a first support and a second support, facing to each other, via adhesives 3 and 4. The part is provided with non-woven fabric 10a and 10b which sandwich IC module 5.

Reinforcement structure 5b is a metal reinforcement plate brought in cross contact with non-circuit surface 5a1 of IC-tip 5a via adhesive 20, and antenna 5c is connected to circuit surface 5a2 of IC-tip 5a. Further, adhesives 3 and 4 are provided directly adjacent to at least a part of IC-tip 5a, and, in the embodiment, adhesive 4 in which non-woven fabric 10b is immersed is directly adjacent to a part of IC-tip 5a. Adhesives 3 and 4 are preferably a reactive-type hot-melt adhesive.

Further, at least one of two supports 1 and 2 facing to each other, a first support 1 in this embodiment, provided with image receiving layer 6, and personal information 7 comprised of a name and a face image is provided on image receiving layer 6. Image receiving layer 6 is provided with protective layer 8. Further, the other second support 2 is provided with writable writing layer 9.

Further, an IC card may be provided with cushion layer 11 between image receiving layer 6 and first support 1, as shown in FIG. 2.

The IC card has a rebound coefficient (h/h0) of from 0.52 to 0.70, wherein a dropping height of a rigid ball (a steel ball) against the IC-card is h0 and a rebound height is h. In a measurement method of a rebound coefficient, an IC card was rigidly fixed on a receiving table having a hole of 27 mm diameter by being sandwiched from upside and downside; a cylinder having approximately the same diameter as a weight shape of a dropping weight was prepared on the IC card; and a weight having a top edge diameter of 20 mm and a weight of 50 g (S45C steel) was free dropped from a height of 60 cm into the center of the receiving table to measure a rebounding height. The apparatus was placed on a sufficiently strong floor to be made rigid not to cause resonance.

A rebound coefficient k is represented by k=h/h0, wherein a dropping height is h0 and a rebound height is h; and it is possible to improve impact strength and to protect a part including an IC module, by defining a rebound coefficient of an IC card.

Further, an IC card of the invention is constituted by accumulating protective layer 8/image receiving layer 6/first support 1/adhesive 3/IC module 5/adhesive 4/second support 2/writing layer 9, in this order from outermost layer of the card, and characterized in that a 2% module of elasticity of adhesives 3 and 4 is not less than 5 kg/mm$^2$ and not more than 55 kg/mm$^2$; an occupying ratio of total thickness D3 of thickness D1 of first support 1 and thickness D2 of second support 2 to card thickness D4 is not less than 0.33 and not more than 0.55; and a ratio of a thickness D5 of IC-tip 5a to total thickness D3 of first support 1 and second support 2 is not less than 0.05 and not more than 0.40.

As a measurement method of 2% module of elasticity, an adhesive of 500 μm thick was cured to prepare an adhesive sheet, and utilizing the adhesive sheet, tensile module of elasticity and tensile break point elongation were measured by use of Tensilon Universal Tester produced by Orientech Co., Ltd. according to ASTM D638.

The IC card is able to improve impact strength of the card, to protect a part including an IC module and to improve durability, as well as to improve a surface property in higher dimensions, by defining a layer configuration and a layer thickness, in addition to elasticity of adhesives 3 and 4.

In what follows, a configuration of an IC card of the invention will be detailed.

<Support>

Examples of a support include single-layered sheets comprised of synthetic resin sheets of such as polyester resins such as polyethylene terephthalate, polybutylene terephthalate, and a polyethylene terephthalate/iso-phthalate copolymer; polyolefin resins such as polyethylene, polypropylene and polymethyl pentene; polyethylene fluoride type resins such as polyvinyl fluoride, polyvinylidene fluoride, polyethylene tetrafluoride and an ethylene/tetrafluoroethylene copolymer; polyamides such as 6-nylon, 6,6-nylon; vinyl polymers such as polyvinyl chloride, a vinyl chloride/vinyl acetate copolymer, an ethylene/vinyl acetate copolymer, an ethylene/vinyl alcohol copolymer, polyvinyl alcohol, vinylon; biodegradable resins such as biodegradable aliphatic polyester, biodegradable polycarbonate, biodegradable polylactic acid, biodegradable polyvinyl alcohol, biodegradable cellulose acetate and biodegradable polycaprolactone; cellulose-type resins such as cellulose triacetate and cellophane; acryl-type resins such as polymethyl methacrylate, polyethyl methacrylate, polyethyl acrylate and polybutyl acrylate; polystylene; polycarbonate; polyallylate and polyimide; or of paper such as wood free paper, thin leaf paper, grassine paper and sulfuric acid paper; and of metal foil; or multi-layered sheets in which two or more sheets thereof are accumulated.

The thickness of a support of the invention is from 30 to 300 μm and preferably from 50 to 200 μm. In case of more than 50 μm, it may be preferable that there may be no thermal shrinkage at the time of laminating the first and the second supports together. In the invention, a coefficient of thermal shrinkage is preferably not more than 1.2% in a longitudinal direction (MD) and not more than 0.5% in a width direction (TD) at 150° C./30 min.

Since it was difficult to register in the following cutting process and printing process due to thermal shrinkage having been caused by temperature in case that an adhesive was coated or laminated for production from both surface sides of the first support and the second support, it is preferred to caused no shrinkage of the supports by utilizing an adhesive, which adheres at low temperatures, and a support, having a coefficient of thermal shrinkage of not more than 1.2% in a longitudinal direction (MD) and not more than 0.5% in a width direction (TD) at 150° C./30 min.

In the invention, preferably utilized is a support, which is prepared by blending with a white pigment to improve opacity and by being annealed to depress a thermal shrinkage percentage, having a thermal shrinkage percentage of not more than 1.2% in a longitudinal direction (MD) and not more than 0.5% in a width direction (TD) at 150° C./30 min. The above-described after processes were proved to become difficult due to shrinkage of a support when a thermal shrinkage percentage is not less than 1.2% in a longitudinal direction (MD) and not less than 0.5% in a width direction (TD). Further, on the above-described support, adhesion enhancing treatment for improving adhesion in the post process or anti-static treatment for tip protection may have been provided.

Concretely, U2 Series, U4 Series and UL Series manufactured by Teijin Dupont Film Co., Ltd.; Clisper G Series manufactured by Toyobo Co., Ltd.; and E00 Series, E20 Series, E22 Series, X20 series, X40 Series, E60 Series and QE Series manufactured by Toray Industries, Inc. can be suitably utilized.

The second support may be optionally provided with an image receiving layer and a cushion layer to form a face image of the card user. An image element is provided on the surface of a personal certification card base, and preferably includes at least one selected from a certifying identification image such as a face image, an attributing information image and format print.

<Image Receiving Layer>

For an image receiving layer, resins well known in the art can be utilized and examples include polyvinyl chloride resins, copolymer resins of vinyl chloride and other monomers (such as isobutylether and vinylpropionate), polyester resins, poly(metha)acrylate esters, polyvinylpyrrolidone, polyvinylacetal-type resins, polyvinylbutyral-type resins, polyvinylalcohol, polycarbonate, cellulose triacetate, polystyrene, copolymers of styrene and other monomer (such as acrylate ester, acrylonitrile and ehtylene chloride), vinyl-tolueneacrylate resins, polyurethane resins, polyamide resins, urea resins, epoxy resins, phenoxy resins, polycaprolactone resins, polyacrylonitrile resins and modified compounds thereof, and preferable are polyvinyl chloride resins, copolymers of vinyl chloride and other monomers, polyester resins, polyvinylacetal-type resins, polyvinylbutyral-type resins, copolymers of styrene and other monomers and epoxy resins.

<Cushion Layer>

Polyolefin is preferable as a material to form a cushion layer of the invention. For example, such as polyethylene, polypropyrene, an ethylene-vinyl acetate copolymer, an ethylene-ethylacrylate copolymer, a styrene-butadiene-styrene block-copolymer, a styrene-isoprene-styrene block-copolymer, a styrene-ethylene-butadiene-styrene block-copolymer, a styrene-hydrogenated isoprene-styrene block-copolymer, polybutadiene and a photo-curable resin; having flexibility and a low thermal conductivity are suitable. Concretely a cushion layer such as described in Japanese Patent Application No. 2001-16934 can be utilized.

A cushion layer referred in the invention means a soft resin layer, which is located between a support and an image receiving layer accepting an image, and functions to relax the effect of roughness caused by an electronic part such as an IC module.

The cushion layer is not particularly limited provided that it is of an embodiment locating a cushion layer between an image receiving layer and an electronic part, however, is specifically preferably formed being coated or laminated on one or both of the surfaces of a support.

<Writing Layer>

A writing layer is a layer which is made to be writable on the back-side of an IC card. Such a writing layer can be formed, for example, by including inorganic fine particles of such as calcium carbonate, talc, diatomaceous earth, titanium oxide and barium sulfate in a film of a thermoplastic resin (e.g. a polyolefin series such as polyethylene, and various kinds of copolymers). It can be formed according to "a write-in layer" described in JP-A (Hereinafter, JP-A refers to Japanese Patent Publication Open to Public Inspection) No. 1-205155. The above-described writing layer is formed on the surface, on which plural layers are not accumulated, of a support.

<Adhesive>

As a hot-melt adhesive for an IC card of the invention, ones commonly used can be uttilized. A main component of a hot-melt adhesive includes, for example, an ethylene-vinylacetate copolymer (EVA) type, a polyester type, a polyamide type, a thermoplastic elastomer type, a polyolefin type, etc. However, in the invention, a card is liable to curl or a layer such as an image receiving layer for image formation by means of thermal transfer, being provided on a card surface and weak in a high temperature process, may be damaged. Further, when being laminated via adhesive, the base materials are preferably laminated at not higher than 80° C., more preferably from 10 to 80° C. and furthermore preferably from 20 to 80° C., in respect to problems in that base materials cause thermal shrinkage due to a high temperature lamination, resulting in poor dimensional and positional precision at the time of lamination. Among low temperature hot-melt adhesives, concretely, a reactive type hot-melt adhesive is preferable. As a reactive hot-melt adhesive, materials of a moisture curable type are disclosed in JP-A Nos. 2000-036026, 2000-219855, 2000-211278 and 2000-219855, and Japanese Patent Application No. 2000-369855. Photo-curable adhesives are disclosed in JP-A Nos. 10-316959 and 11-5964

Any of these adhesive may be used, and unlimited materials are preferably utilized in the invention. A layer thickness of an adhesive, provided being in a range of the invention, is preferably from 10 to 600 μm, more preferably from 10 to 500 μm and furthermore preferably from 10 to 450 μm, based on a thickness including the electronic part. In the invention, by utilizing an adhesive having a low module of elasticity of such as in a range from 5 to 55 kg/mm$^2$, it is possible to relax stress and to obtain excellent durability.

<Electronic Part (IC Module)>

An electronic part indicates an information recording member and concretely an IC module comprised of an IC-tip, which electrically records information of an electronic card user, and a coil-shaped antenna element connected thereto. An IC-tip is comprised of only a memory or of a microcomputer in addition thereto. Optionally, an electronic part may also include a condenser.

The invention is not limited thereto, and an electronic part is not particularly limited provided that it is necessary for an information recording member. An IC module is provided with an antenna; in case of being provided with an antenna pattern, it may be prepared by any method such as an electric-conductive paste printing process, a copper foil etching process and a wire welding process.

As a printed board, a thermoplastic film such as polyester is utilized, and polyimide is advantageously used in case of high thermal-resistance being required. The bonding of an antenna pattern with an IC-tip is performed by any method commonly known such as a method utilizing electrical-conductive adhesives such as silver paste, copper paste, carbon paste, etc. (for example, EN-4000 Series manufactured by Hitachi Chemical Co., Ltd. and XAP Series manufactured by Toshiba Chemical Corp.); a method utilizing anisotropic electrical-conductive film (such as Anisolm manufactured by Hitachi Chemical Co., Ltd.); and a method applying solder bonding.

To avoid poor stability, such as disconnecting at bonding portions due to shear stress by adhesive flow, and damaging smoothness of the surface due to flow or cooling of an adhesive, caused by filling an adhesive layer resin after a part including an IC-tip is mounted on a predetermined position in advance, a part, to be enclosed in the adhesive layer on a board sheet in advance, is preferably prepared in a form of a porous resin film, a porous foaming resin film, a flexible resin sheet, a porous resin sheet or a non-woven fabric sheet. For example, a method described in Japanese Patent Application No. 11-105476 can be utilized.

For example, a non-woven fabric sheet member includes mesh-form fabric made of non-woven fabric, fabric of plain weave, twilled weave and satin weave. Further, fabric having piles called such as mocket, plushbelour, seal, velvet and suede can be utilized. Materials include fiber of combinations of one or not less than two kinds selected from synthetic resins of a polyamide type such as type 6-nylon, 66-nylon and 8-nylon, a polyester type such as polyethylene terephthalate, a polyolefin type such as polyethylene, polyvinyl alcohol, a polyvinilidene chloride type, a polyvinyl chloride type, an acryl type such as polyacrylonitrile, acrylamide and methacrylamide, a polyvinylidene cyanate type, a polyfluoroethylene type and polyurethane type; natural fibers such as silk, cotton, wool, a cellluose type and a cellulose ester type; regenerated fiber (rayon and actate) and aramide fiber.

Among these fabric materials preferable are a polyamide type such as 6-nylon and 66-nylon, an acryl type such as polyacrylnitrile, acrylamide and methacrylamide, a polyester type such as polyethylene terephthalate, a cellulose type as a regenerated fiber, a cellulose ester type such as rayon and acetate and aramide fiber. Since an IC-tip is weak in strength against point pressure, a metal reinforcement plate as a reinforcement structure is preferably provided in the neighborhood of an IC-tip. The total thickness of an electronic part is preferably from 10 to 300 $\mu$m, more preferably from 30 to 300 $\mu$m and furthermore preferably from 30 to 250 $\mu$m.

<Method to Provide Electronic Part Having Prescribed Thickness Between First Support and Second Support>

As a manufacturing method to provide a predetermined electronic part between the first support and the second support of the invention, a thermal lamination method, an adhesive lamination method and an injection molding method are well known and any of the methods can be utilized. Format printing or information recording may be performed before or after the first support and the second support being laminated, and it can be formed by any method such as off-set printing, gravure printing, silk printing, screen printing, intaglio printing, letterpress printing, an ink jet method, a sublimation transfer method, an electrophotographic method and a thermal fusion method.

A manufacturing method of an IC card of the invention is comprised of at least a process in which an adhesive member, being in a state of solid or viscous body at ordinary temperature and softened in a heated state, is provided on a support for an IC card, a process in which an electronic part is arranged on the support, a process in which a support for the front surface provided with an adhesive member is arranged so as to cover the electronic part on the support, and a process in which a support, an electronic part and a support for the front surface are laminated together; and lamination is preferably performed.

The adhesive member being a solid body or a viscous body and softened in a heated state is preferably prepared by a method in which an adhesive itself is formed in a sheet-form, or by a method in which an adhesive itself is melt by heat or at ordinary temperature and laminated by means of an injection molding method.

Temperature of enabling to adhere an electronic part predetermined between the first support and the second support is preferably not higher than 80° C., more preferably from 0 to 80° C. and furthermore preferably from 20 to 70° C. A cooling process is preferably provided after the lamination to reduce such as warp of a support. Cooling temperature is preferably not higher than 70° C., more preferably from −10 to 70° C. and furthermore preferably from 10 to 60° C.

At the time of lamination, to enhance smoothness of a base surface and adhesion property of an electronic part predetermined between the first support and the second support, they are preferably subjected to heating and pressing, and preferably manufactured by such as an up-and-downward pressing and lamination method. Further, it is preferred to avoid utilizing rolls which provides nearly linear contact and unreasonable bending force with even a slight shift, and to adopt a planer-press type, taking cracking of IC-parts into consideration. The heating is preferably performed at from 10 to 120° C. and more preferably from 30 to 100° C. The press is preferably performed at from 0.1 to 300 kgf/cm$^2$ and more preferably at from 0.1 to 100 kgf/cm$^2$. When the pressure is higher than this, an IC-tip may be collapsed. The time for heating and pressing is preferably from 0.1 to 180 sec. and more preferably from 0.1 to 120 sec.

In an IC card of the invention, an adhesive is preferably provided directly on an IC-tip. This relaxes stress applied on an IC-tip and improves durability.

A laminated sheet or a continuously coated lamination roll, prepared as a continuous sheet by an adhesive-lamination method or a resin injection method described above, may be recorded with certifying identification images and bibliographic items after being allowed to stand for a time equal to a predetermined curing time of an adhesive; thereafter, may be shaped into a prescribed card size. As methods for shaping into a prescribed card size, such as a stamping method and a cutting method are mainly selected.

<General Description on Image Forming Method of Image Recording Element>

An image recording element of an IC card according to the invention is provided with an image element of at least one selected from a certifying identification image such as a face image, an attribute information image and a format printing is formed on a an image or printing surface side of a substrate. A face image is generally a full-colored image having tone, and is prepared, for example, by a sublimation thermal transfer recording method or a silver halide color photographic method. A letter information image, comprises a binary image, and is formed, for example, by such as a fusion thermal transfer recording method, a sublimation thermal transfer recording method, a silver halide color photographic method, electrophotographic method, or an ink-jet method.

In the invention, it is preferable to record a certifying identification image such as a face image and an attribute information image by a sublimation thermal transfer recording method. Attribute information include a name, an address, a birth date, a license, etc., and are recorded, usually as letter information, generally by means of a fusion thermal transfer recording method. A format printing or information recording may also be performed, and this can be formed by any method such as offset printing, gravure printing, silk printing, screen printing, intaglio printing, letterpress printing, an ink-jet method, a sublimation transfer method, an electrophotographic method and a thermal fusion method.

Further, for the purpose of preventing forgery and alternation, an optical variable device described below such as a hologram and a fine structure tint may be adopted. A layer to prevent forgery and alternation is optionally selected from a printed matter, a hologram, a bar cord, a matte pattern, a fine structure tint, a ground tint and a roughened pattern, and is comprised of a visible light absorbing colorant, a UV absorbent, an infrared absorbent, a fluorescent brightener, a metal evaporated layer, a glass evaporated layer, a bead layer, an optical variable element layer, a pearl ink layer and a scaly pigment layer.

An ink sheet for sublimation thermal transfer recording of a sublimation image forming method can be composed of a support and an ink layer formed thereon containing sublimation dyes.

Support

As a support, there is no specific limitation, and those well known in the art, provided being superior in dimensional stability and resistant against heat at the time of recording with a thermal head, can be utilized.

Sublimation Dye Containing Ink Layer

The sublimation dye containing ink layer described above basically contains a sublimation dye and a binder. The above-described sublimation dye includes cyan dyes, magenta dyes and yellow dyes. The cyan dyes include naphthoquinone type dyes, anthraquinone type dyes and azomethine type dyes described in such as JP-A Nos. 59-78896, 59-227948, 60-24966, 60-53563, 60-130735, 60-131292, 60-239289, 61-19396, 61-22993, 61-31292, 61-31467, 61-35994, 61-49893, 61-148269, 62-191191, 63-91288, 63-91287 and 63-290793.

The magenta dyes include anthraquinone type dyes, azo type dyes and azomethine type dyes described in such as JP-A Nos. 59-78896, 60-30392, 60-30394, 60-253595, 61-262190, 63-5992, 63-205288, 64-159 and 64-63194. The yellow dyes include methine type dyes, azo type dyes, quinophthalone type dyes and anthraisothiazole type dyes described in such as JP-A Nos. 59-78896, 60-27594, 60-31560, 60-53565, 61-12394 and 63-122594.

Specifically preferable sublimation dyes are azomethine dyes obtained by coupling reaction of compounds having a closed-chain type or open-chain type active methylene group, with oxidants of p-phenylenediamine derivatives or those of p-aminophenol derivatives; and indoaniline dyes obtained by coupling reaction of phenol or naphthol derivatives with oxidants of p-phenylenediamine derivatives or those of p-aminophenol derivatives.

Further, when a metal ion containing compound is included in an image receiving layer, it is preferable to include a sublimation dye that forms a chelate upon reaction with the metal ion containing compound, in a sublimation dye including ink layer. Examples of the chelate forming sublimation dyes include cyan dyes, magenta dyes and yellow dyes, forming a chelate of at least bidentate, described in JP-A Nos. 59-78893 and 59-109349, Japanese Patent Application Nos. 2-213303, 2-214719 and 2-203742. Preferable sublimation dyes capable of forming a chelate can be represented by the following general formula:

$$X_1-N=N-X_2\text{-}G$$

where, $X_1$ represents an aromatic carbon ring, in which at least one ring is composed of 5 to 7 atoms, or an atomic group necessary to complete a heterocyclic ring, provided that at least one of the adjacent positions to carbon atoms which bond to the azo bond is a carbon atom substituted by a nitrogen atom or a chelating group; $X_2$ represents an heterocyclic ring, in which at least one ring is composed of 5 to 7 atoms, or an aromatic carbon ring; and G represents a chelating group.

Any sublimation dyes contained in the sublimation dye containing ink layer above described, may be any of a yellow dye, a magenta dye and a cyan dye when an image to be formed is monocolor, and any two or more dyes out of three dyes above described or other sublimation dyes may be contained depending on the color of an image to be formed. The using amount of sublimation dyes described above generally from 0.1 to 20 g and preferably 0.2 to 5 g, based on 1 $m^2$ of a support. A binder for an ink layer is not specifically limited, and those well known in the art can be used. Further, in the aforementioned ink layer, various kinds of additives well known in the art can be suitably added. An ink sheet for sublimation thermal transfer recording can be prepared in such a manner that ink layer coating solution, which has been prepared by dispersing or solving various ink layer components described above, is coated on a support and then dried. The thickness of thus prepared ink layer is generally from 0.2 to 10 $\mu$m and preferably from 0.3 to 3 $\mu$m.

EXAMPLES

The invention will be described below, based on examples, however the embodiment of the invention is not limited thereto. Hereinafter, "part(s)" represents "part(s) by weight".

<Preparation of Adhesive>

Adhesive 1

Macroplast QR3460 (a 2% module of elasticity is 18 kg/mm$^2$, moisture-curable type adhesive) manufactured by Henkel Co. was used.

| Adhesive 2 | |
|---|---|
| Macroplast QR3460 (moisture-curable adhesive), manufactured by Henkel Co. | 80 parts |

Porous high silica aluminosilicate (ATM-SILCA#200B; manufactured by Mizusawa Kagakukogyo Co.) 20 parts The above-described components were stirred by a homogenizer at 150° C. for 60 min to prepare adhesive 2.

Adhesive 2 was formed into an cured adhesive sheet having a thickness of 500 μm, and tensile module of elasticity of the adhesive sheet was measured by use of Tensilon Universal Tester RTA-100 produced by Orientech Co., Ltd. according to ASTM D638. A 2% module of elasticity was 30 kgf/mm².

| Adhesive 3 | |
|---|---|
| Macroplast QR3460 (moisture-curable adhesive), manufactured by Henkel Co. | 80 parts |
| Urethane type hot melt adhesive | 20 parts |

Adhesive 4

Aronalpha GEL-10 (2% module of elasticity is 60 kg/mm², manufactured by Toagosei Co., Ltd.) was used.

<Electronic Part; Preparation of IC Module>

Figure 3:
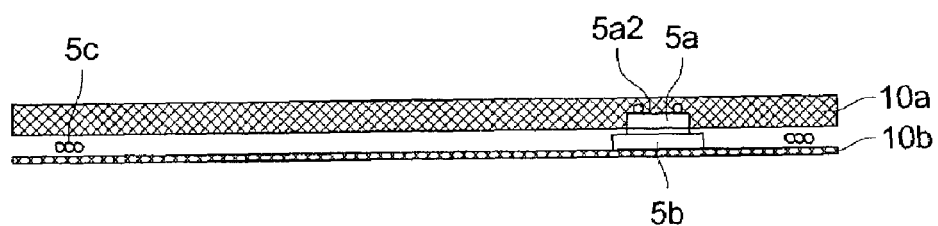
FIG. 3 shows a configuration of an IC module.

IC Module 1;

A plate-form reinforcement structure of 120 μm thick and 4×4 mm square comprised of SUS 301 was adhered on the opposite side to a circuit plane of an IC-tip of 50 μm thick and 3×3 mm square by use of an epoxy-type resin to form an wire-type antenna, which was bonded to a bump formed on an IC-tip. Next, an IC module was sandwiched from both sides with a non-woven sheet comprised of polyethylene terephthalate fiber to prepare IC module 1. This is shown in FIG. 3.

IC Module 2;

A plate-form reinforcement structure of 120 μm thick and 5×5 mm square comprised of SUS 301 was adhered on the opposite side to a circuit plane of an IC-tip of 25 μm thick and 3×3 mm square by use of an epoxy-type resin to form an wire-type antenna, which was bonded to a bump formed on an IC-tip. Next, an IC module was sandwiched from both sides with a non-woven sheet comprised of polyethylene terephthalate fiber to prepare IC module 2.

Figure 4:
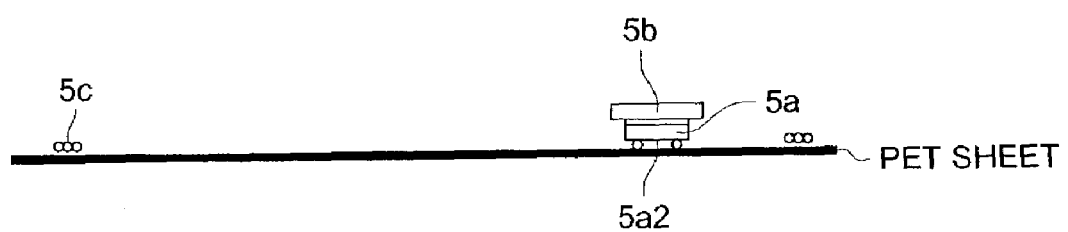
FIG. 4 shows a configuration of an IC module.

IC Module 3;

An IC-tip of 65 μm thick and 3×3 mm square was adhered by use of an electro-conductive adhesive of 20 μm thick on a support (PET sheet) having a thickness of 38 μm on which an antenna pattern had been formed by etching, and a plate-form reinforcement structure of 120 μm thick and 4×4 mm square comprised of SUS 301 was adhered on the opposite side to a circuit plane of the IC-tip by use of an epoxy-type resin of 10 μm thick to prepare IC module 3. This is shown in FIG. 4.

Figure 5:
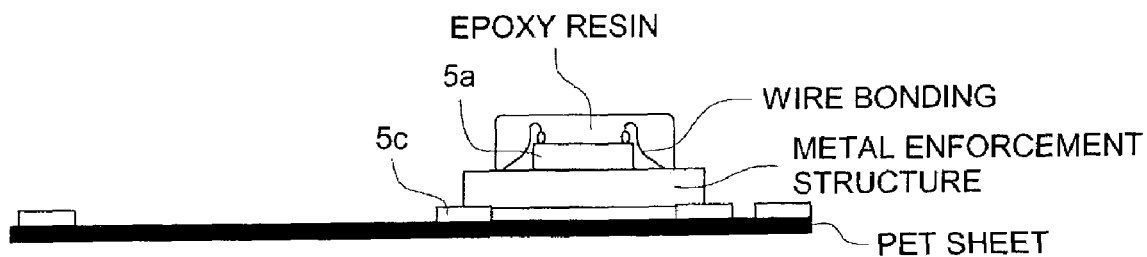
FIG. 5 shows a configuration of an IC module.

IC Module 4;

An IC module of 350 μm thick, in which an IC-tip was adhered on a lead frame board (a metal reinforcement structure) by means of wire-bonding and shielded by use of an epoxy-type resin, was adhered onto a support (PET sheet) having a thickness of 50 μm, on which an antenna pattern had been formed by etching, to prepare IC module 4. This is shown in FIG. 5.

<First Support, Second Support>

Support 1;

A white polyester sheet having a thickness of 188 μm was used as the first support and the second support.

Support 2;

A white polyester sheet having a thickness of 125 μm was used as the first support and the second support.

Support 3;

A white polyester sheet having a thickness of 100 μm was used as the first support and the second support.

Support 4;

White polyvinyl chloride resin sheets having a thickness of 100 μm were used as the first support and the second support, respectively.

Example 1

<Preparation of IC Card>

Figure 6:
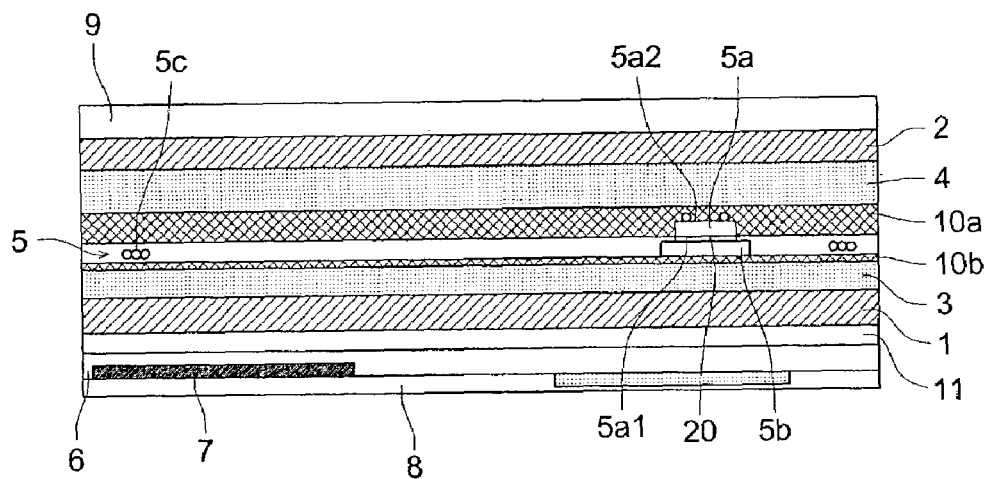
FIG. 6 shows an exemplary accumulated layer configuration of a personal certification card.

FIG. 6 shows an example of an accumulated layer configuration of an IC card or a personal certification card according to the invention.

<Preparation of Surface Support>

<Support 1>

The first image receiving layer coating solution, the second image receiving layer coating solution and the third image receiving layer coating solution, having the compositions described below, were coated and then dried, in this order, on a corona discharge treated surface of a 188 μm support sheet to be accumulated so as to make each thickness of 0.2 μm, 2.5 μm and 0.5 μm. Thus an image receiving layer was formed.

| <First Image Receiving Layer Coating Solution> | |
|---|---|
| Polyvinyl butylal resin (Eslec BL-1, manufactured by Sekisui Chemical Co., Ltd.) | 9 parts |
| Isocyanate (Coronate HX, manufactured by Nippon Polyurethane Kogyo Co., Ltd.) | 1 part |
| Methyl ethyl ketone | 80 parts |
| Butyl acetate | 10 parts |
| <Second Image Receiving Layer Coating Solution> | |
| Polyvinyl butyral resin (Eslec BX-1, manufactured by Sekisui Chemical Co., Ltd.) | 6 parts |
| Metal ion containing compound (Compound MS) | 4 part |
| Methyl ethyl ketone | 80 parts |
| Butyl acetate | 10 parts |
| <Third Image Receiving Layer Coating Solution> | |
| Polyethylene wax (Hitech E1000, manufactured by Toho Chemical Industry Co., Ltd.) | 2 parts |
| Urethane modified ethylene acrylic acid copolymer (Hitech S6254, manufactured by Toho Chemical Industry Co., Ltd.) | 8 parts |
| Methyl cellulose (SM15, manufactured by Shin-Etsu Chemical Co., Ltd.) | 0.1 part |
| Water | 90 parts |

<Format Printing>

A logogram and OP varnish were printed successively by a resin letterpress method.

<Preparation of Second Support>

<Preparation of Writing Layer>

The first writing layer coating solution, the second writing layer coating solution and the third writing layer coating solution, having the compositions described below, were coated and then dried, in this order, on a corona discharge treated surface of the 188 μm back support sheet described above to be accumulated so as to make each thickness of 5 μm, 15 μm and 0.2 μm. Thus a writing layer was formed.

| <First Writing Layer Coating Solution> | |
| --- | --- |
| Polyester resin (Vilon 200, manufactured by Toyobo Co., Ltd.) | 8 parts |
| Isocyanate (Coronate HX, manufactured by Nippon Polyurethane Kogy Co., Ltd.) | 1 part |
| Carbon black | a slight amount |
| Titanium dioxide particles (CR80, manufactured by Ishihara Sangyo Kaisha Ltd.) | 1 part |
| Methyl ethyl ketone | 80 parts |
| Butyl acetate | 10 parts |
| <Second Writing Layer Coating Solution> | |
| Polyester resin (Vilonal MD1200, manufactured by Toyobo Co., Ltd.) | 4 parts |
| Silica | 5 parts |
| Titanium dioxide particles (CR80, manufactured by Ishihara Sangyo Kaisha Ltd.) | 1 part |
| Water | 90 parts |
| <Third Writing Layer Coating Solution> | |
| Polyamide resin (Sunmide 55, manufactured by Sanwa Chemical Ind. Co., Ltd.) | 5 parts |
| Methanol | 95 parts |

A center line mean roughness of the writing layer obtained was 1.34 μm.

<Preparation of Sheet for IC Card>

Figure 7:
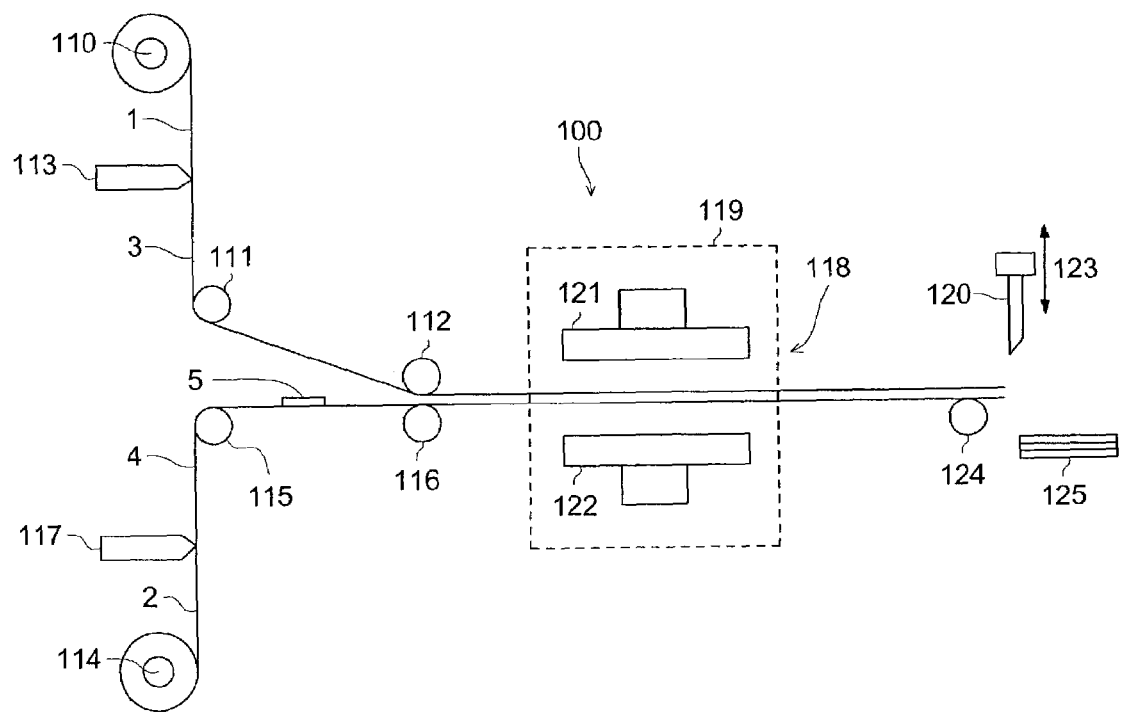
FIG. 7 shows a card producing apparatus.

FIG. 7 shows an example of a producing apparatus of an IC card according to the invention.

IC card producing apparatus 100 is equipped with a sending-out axis 110 which sends out first support 1, and first support 1 being sent out from sending-out axis 110 is fed being hanged through guide roller 111 and drive roller 112. Applicator coater 113 is arranged between sending-out axis 110 and guide roller 111. Applicator coater 113 coats adhesive 3 on a sheet at a predetermined thickness.

Further, IC card producing apparatus 100 is equipped with sending-out axis 114 which sends out second support 2, and the second support 2 being sent out from sending-out axis 114 is fed being hanged through guide roller 115 and drive roller 116. Applicator coater 117 is arranged between sending-out axis 114 and guide roller 115. Applicator coater 117 coats adhesive 4 on a sheet at a prescribed thickness.

First support 1 and second support 2, on which an adhesive having been coated, are brought in contact to be transported along transporting passage 118 from the state of facing to each other while being separated. IC module 5 is inserted at the position where first support 1 and second support 2 are facing to each other while being separated. IC module 5 is fed as an unite, or as plural units in a sheet-form or a roll-form. In transport passage 118 of IC card producing apparatus 100, heat laminator section 119 and cutting section 120 are arranged along a transport direction of first support 1 and second support 2. A heat laminator is preferably a vacuum heat laminator. Further, protective film supply sections may be provided before heat laminator section 119 and are preferably arranged over and under transport passage 118 facing to each other. Heat laminator section 119 is constituted of heat laminator over-type 121 and heat laminator under-type 122 arranged over and under transport passage 118 facing to each other. Heat laminator over-type 121 and heat laminator under-type 122 are set to be shiftable in a direction of contacting with and separating from each other. The sheet material is cut into a prescribed size after passing through heat laminator section 119.

<Preparation of Sheet 1 for IC Card>

A card producing apparatus of FIG. 7 was utilized and the above-described second support and the first support having an image receiving layer, which were prepared by use of "Support 1", are utilized as the first support and the second support.

Figure 8:
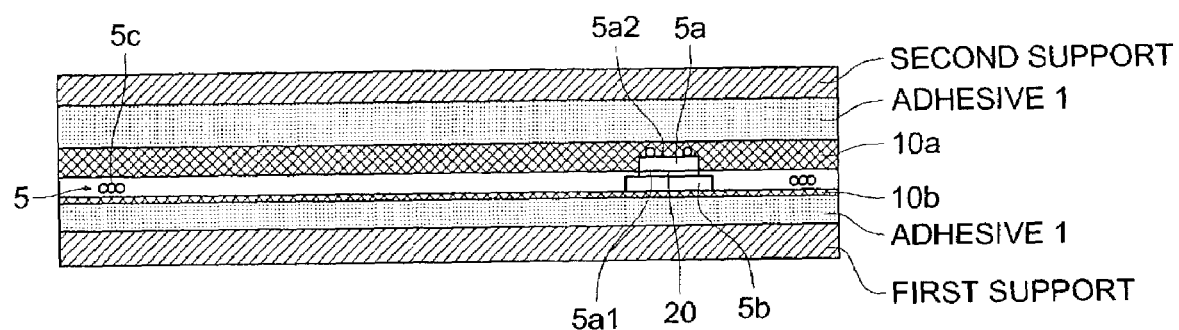
FIG. 8 shows a schematic layer configuration of an IC card.

Adhesive 1 was coated on the first support having an image receiving layer by use of T dies so as to make a thickness of 40 μm; adhesive 1 was coated on the second support having an image receiving layer by use of T dies so as to make a thickness of 300 μm; IC module 1 of a configuration shown in FIG. 3 was mounted on the first support having the adhesive so as to the circuit plane was on the support side as shown in FIG. 8, and then sandwiched by up and down sheets; and the resulting configuration was laminated for 1 minute at 70° C. to prepare sheet 1 for an IC card. The sheet after preparation was kept for 7 days under an environment of 25° C. and 50% RH.

A sheet for an IC card thus prepared was subjected to a stamping process by use of the following IC card stamping dies apparatus.

Figure 9:
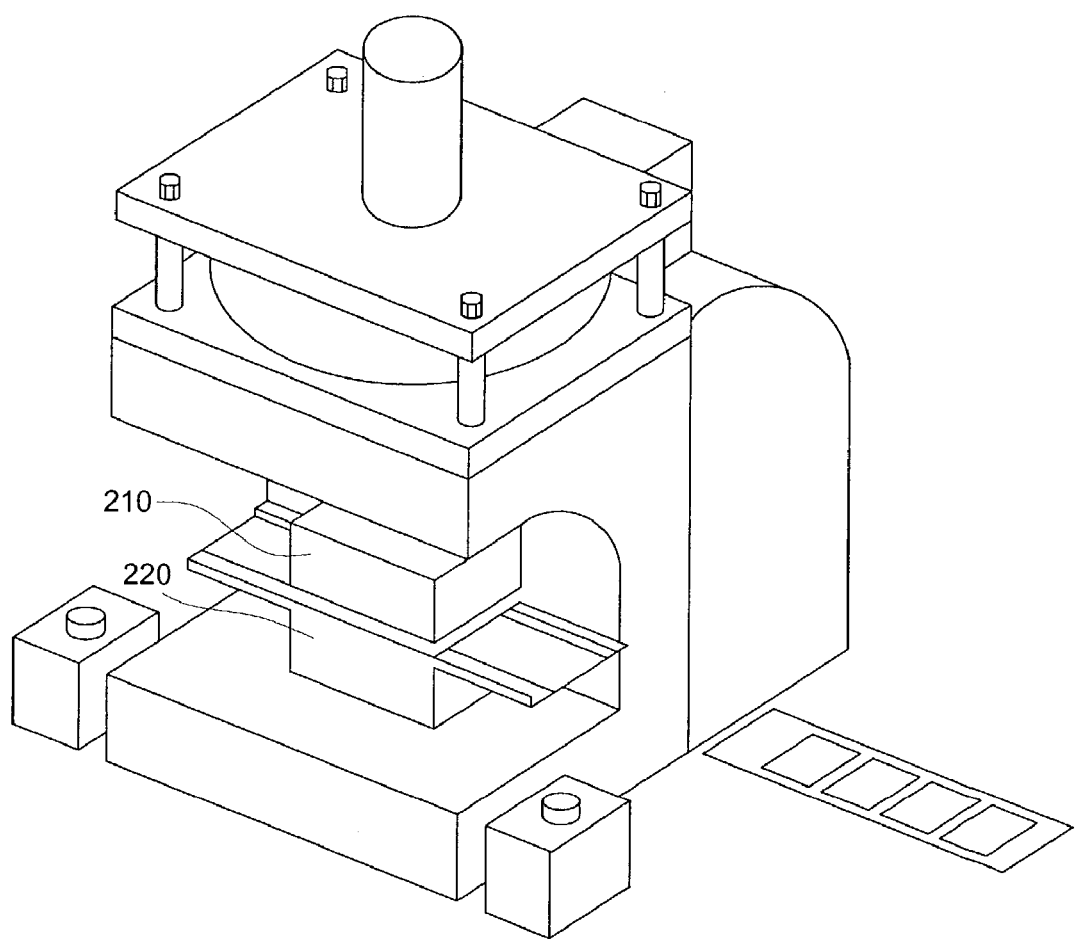
FIG. 9 shows a schematic total oblique view of a stamping dies apparatus.
Figure 10:
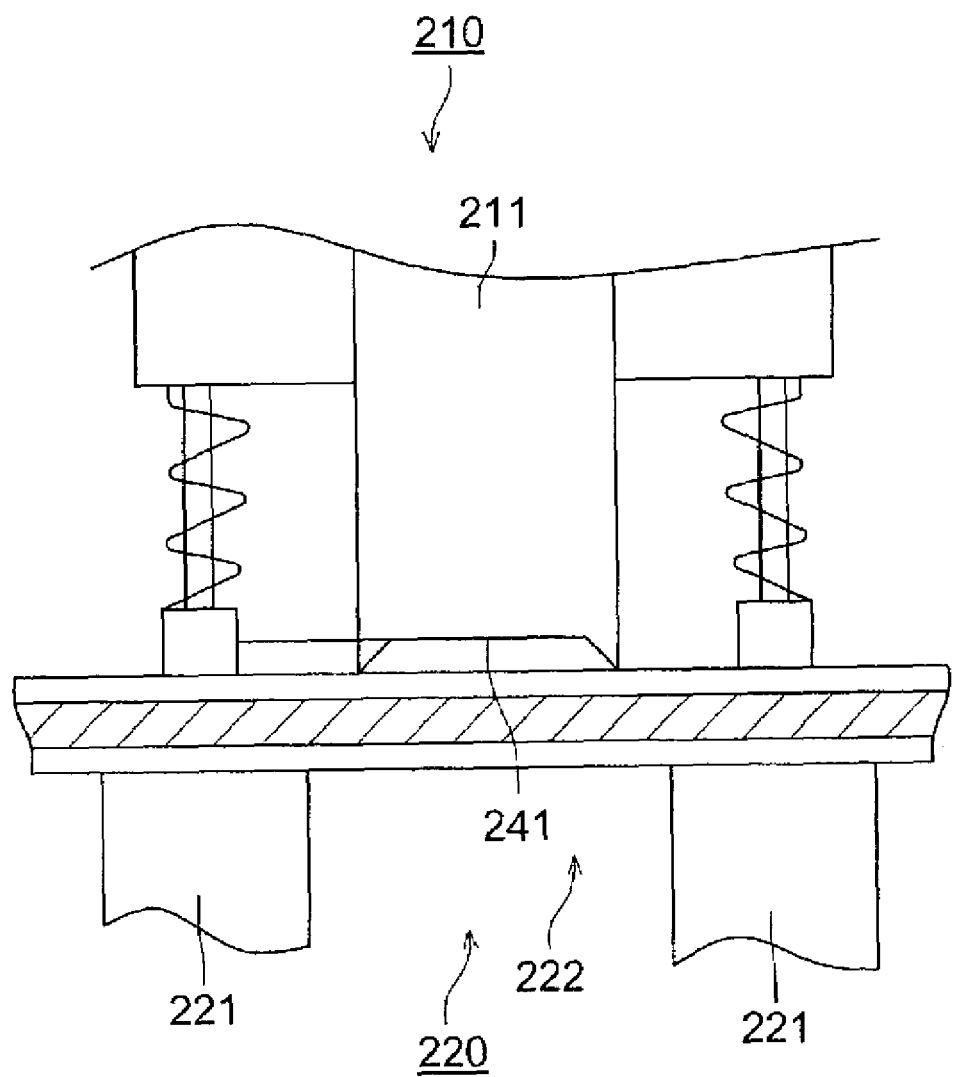
FIG. 10 shows a front end view of a main portion of a stamping apparatus.

FIG. 9 is a brief oblique view drawing of a stamping dies apparatus and FIG. 10 is a front end view drawing of a main portion of a stamping dies apparatus.

The stamping dies apparatus provided with a stamping dies having over blade 210 and under blade 220. Herein, over blade 210 includes stamping punch 211 provided with escape 241 at the inside of an outer edge and under blade 220 has stamping dies hole 222. An IC card having the same size as that of dies hole 222 is stamped by descending stamping punch 211 into dies hole provided at the center of stamping dies 221. Further, for this purpose, the size of stamping punch 211 is slightly smaller than the size of stamping dies hole 222.

<Information Recording Method on Personal Certification Card and Surface Protection Method>

A face image, attribute information and a format printing were provided according to the following manner on the above-described IC card having been subjected to a stamping process to prepare a personal certification card.

<Preparation of Ink Sheet for Sublimation Thermal Transfer Recording>

Ink sheets of three colors of yellow, magenta and cyan were obtained by providing a yellow ink layer coating solution, a magenta ink layer coating solution and a cyan ink layer coating solution of the following compositions on a polyethylene terephthalate sheet of 6 μm thick, the back-side thereof being subjected to anti-melt-adhesion treatment, so as to make each thickness of 1 μm.

| <Yellow Ink Layer Coating Solution> | |
| --- | --- |
| Yellow dye (Compound Y-1) | 3 parts |
| Polyvinylacetal (Product of Denki-Kagaku Ind. Co., Ltd.: Denkabutyral KY-24) | 5.5 parts |

-continued

| | |
|---|---|
| Polymethyl methacrylate modified polystyrene (Product of Toa-Goseikagaku Ind. Co., Ltd.: Lededa GP-200) | 1 part |
| Urethane modified silicone oil (Product of Dainichi-Seika Ind. Co., Ltd.: Diaromer SP-2105) | 0.5 parts |
| Methyl ethyl ketone | 70 parts |
| Toluene | 20 parts |
| <Magenta Ink Layer Coating Solution> | |
| Magenta dye (Compound M-1) | 2 parts |
| Polyvinylacetal (Product of Denki-Kagaku Ind. Co., Ltd.: Denkabutyral KY-24) | 5.5 parts |
| Polymethyl methacrylate modified polystyrene (Product of Toa-Goseikagaku Ind. Co., Ltd.: Lededa GP-200) | 2 parts |
| Urethane modified silicone oil (Product of Dainichi-Seika Ind. Co., Ltd.: Diaromer SP-2105) | 0.5 parts |
| Methyl ethyl ketone | 70 parts |
| Toluene | 20 parts |
| <Cyan Ink Layer Coating Solution> | |
| Cyan dye (Compound C-1) | 1.5 parts |
| Cyan dye (Compound C-2) | 1.5 parts |
| Polyvinylacetal (Product of Denki-Kagaku Ind. Co., Ltd.: Denkabutyral KY-24) | 5.6 parts |
| Polymethyl methacrylate modified polystyrene (Product of Toa-Goseikagaku Ind. Co., Ltd.: Lededa GP-200) | 1 part |
| Urethane modified silicone oil (Product of Dainichi-Seika Ind. Co., Ltd.: Diaromer SP-2105) | 0.5 parts |
| Methyl ethyl ketone | 70 parts |
| Toluene | 20 parts |

<Preparation of Ink Sheets for Fusion Thermal Transfer Recording>

An ink sheet was obtained by coating and drying an ink layer coating solutions of the following compositions so as to make a thickness of 2 $\mu$m on a polyethylene terephthalate sheet of 6 $\mu$m thick, the back-side thereof being subjected to anti-melt-adhesion treatment.

| <Ink Layer Coating Solution> | |
|---|---|
| Carnauba wax | 1 part |
| Ethylene vinylacetate copolymer (Product of Mitsui Dupont Chemicals Co.: EV40Y) | 1 part |
| Carbon black | 3 parts |
| Phenol resin (Product of Arakawa-Kagaku Ind. Co., Ltd.: Tamario1521) | 5 parts |
| Methyl ethyl ketone | 90 parts |

<Formation of Face Image>

A personal image having tone was formed on the image receiving layer by overlapping an image receiving layer and an ink-side of an ink sheet for sublimation thermal transfer recording, and heating from the ink sheet side by use of a thermal head under conditions of an output power of 0.23 W/dot, a pulse width of from 0.3 to 4.5 m·sec and a dot density of 16 dot/mm. In the image, dyes described above and nickel in the image receiving layer formed complexes.

<Formation of Letter Information>

Letter information was formed on OP vanish by overlapping an OP vanish portion and an ink side of an ink sheet for fusion-type thermal transfer recording and heating from the ink sheet side by use of a thermal head under conditions of an output power of 0.5 W/dot, a pulse width of 1.0 m·sec and a dot density of 16 dot/mm.

<Surface Protecting Method>

<Preparation of Surface Protective Layer>

<Preparation of Actinic-ray Curable Transfer Foil 1>

The following compositions were accumulated on a peeling layer of polyethylene terephthalate film 2 of 25 $\mu$m thick, on which a peeling layer comprised of fluorine resin layer of 0.1 $\mu$m had been provided, to prepare actinic-ray curable transfer foil 1.

| <Actinic-ray Curable Compound> | |
|---|---|
| Product of Shin-Nakamura Kagaku Co., Ltd.: A-9300/ Product of Shin-Nakamura Kagaku Co., Ltd.: EA-1020 = | 35/1.75 parts |
| Reaction initiator: Irgacure 184, manufactured by Ciba Geigie Co. | 5 parts |
| Additive: unsaturated group containing resin | 48 parts |
| Other additive: Surfactant F-179, manufactured by Dainippon Ink & Cemicals Inc. | 0.25 parts |
| <Intermediate Layer Coating Solution> | |
| Layer thickness: | 1.0 $\mu$m |
| Polyvinyl butyral resin (Product of Sekisui Chemicals Co., Ltd., Eslec BX-1) | 3.5 parts |
| Taftex M-1913 (Asahi Chemical Industry Co., Ltd.) | 5 parts |
| Hardener: Polyisocyanate (Coronate HX, manufactured by Nippon Polyurethane Co., Ltd.) | 1.5 parets |
| Methyl ethyl ketone | 90 parts |
| Curing after coating of a hardener was performed at 50° C. for 24 hours. | |
| <Adhesive Layer Coating Solution> | |
| Layer thickness: | 0.5 $\mu$m |
| Urethane modified ethylene-ethylacrylate copolymer (Product of Toho Kagakukogyo Co., Ltd.: Hitech S6254B) | 8 parts |
| Polyacrylic acid ester copolymer (Product of Nippon Junyaku Co., Ltd.: Julimer AT510) | 2 parts |
| Water | 45 parts |
| Ethanol | 40 parts |

Further, a protective layer was transferred on the above-described image receiving layer on which images and letters were recorded, by utilizing actinic-ray curable transfer foil 1 comprised of the foregoing composition and by use of a heat roller of 5 cm diameter having a rubber hardness of 85 and being heated at a surface temperature of 200° C. and a pressure of 150 kg/cm$^2$ in 1.2 sec. The card prepared had a thickness of 760 $\mu$m and a rebound coefficient of a card was measured to be 0.61.

<Evaluation>

<Repeated Bending Test>

Repeated bending of 100 times was performed, being clamped on a tip, at an amplitude of 50 mm, a gap of 30 mm and 120 times/min, by use of a crumple tester of JIS K6404-6. Movement, deformations and breaks were confirmed after the test.

A: No change is observed without deformations and peeling,

B: No problem without deformations and peeling, but a trace is observed,
C: No peeling breaks but deformations are observed,
D: Deformations and peeling breaks are observed.

<Test of Strength Against Point Pressure>

A load of 1 kg with a steel ball having a top edge diameter of 1 mm was applied 200 times to each of a circuit plane and a non-circuit plane of an IC-tip, placed on a rubber sheet having a hardness of 50. Movement, deformations and breaks were confirmed after the test.

A: No change is observed without deformations and peeling,
B: No problem without deformations and peeling, but a trace is observed,
C: No peeling breaks but deformations are observed,
D: Deformations and breaks are observed.

<Impact Test>

By use of a dropping body type impact tester of JIS K5600•5-3, a card was rigidly fixed on a receiving table having a hole of 27 mm inner diameter by being sandwiched from upside and downside so that an IC-tip was positioned at the center, and a weight having a top edge diameter of 20 mm and a weight of 100 gf (S45C steel) was free dropped from a height of 10 cm on an IC-tip at the center of the receiving table. Movement, deformations and breaks were confirmed after the test.

A: No change is observed without deformations and peeling,
B: No problem without deformations and peeling but a trace is observed,
C: No peeling breaks but deformations are observed,
D: Deformations and peeling breaks are observed.

<Roughness Property>

A sublimation image was printed on a card prepared and degree of scratchiness was evaluated.

A: to be printed without problems,
B: there is a portion of decreased density
C: there is a portion of complete color missing The example are shown in Table 1 and the results in Table 2.

TABLE 2

| | Impact test | | Repeated bending test | | Test of strength against point pressure | | Print-ability Rough-ness |
|---|---|---|---|---|---|---|---|
| | Physical durability | Electrical durability | Physical durability | Electrical durability | Physical durability | Electrical durability | |
| Example 1 | A | Movement OK | A | Movement OK | A | Movement OK | A |
| Example 2 | A | Movement OK | A | Movement OK | A | Movement OK | A |
| Example 3 | A | Movement OK | A | Movement OK | A | Movement OK | A |
| Example 4 | A | Movement OK | A | Movement OK | A | Movement OK | A |
| Example 5 | B | Movement OK | A | Movement OK | B | Movement OK | A |
| Comp. 1 | D | Movement NG | C | Movement NG | D | Movement NG | B |
| Comp. 2 | C | Movement NG | C | Movement NG | C | Movement NG | B |
| Comp. 3 | D | Movement NG | D | Movement NG | D | Movement NG | C |

Example 2

Example 2 was prepared in a similar manner to example 1, except that "Support 1" was utilized as the first and second supports and sheet 2 for an IC card was prepared as follows.

<Preparation of Sheet 2 for IC Card>

A card producing apparatus of FIG. 7 was utilized and the above-described second support and the first support having an image receiving layer, which were prepared by use of "support 1", are utilized as the first support and the second support. Adhesive 1 was coated on the first support having

TABLE 1

| | Module | Support | Kind of adhesive | Card thickness (μm) | Support thickness (μm) | Tip thickness (μm) | Support ratio | Tip ratio | 2% module of elasticity (kg/mm²) | Rebound coefficient |
|---|---|---|---|---|---|---|---|---|---|---|
| Example 1 | Module 1 | Support 1 | Adhesive 1 | 760 | 188 | 50 | 0.49 | 0.13 | 18 | 0.61 |
| Example 2 | Module 2 | Support 1 | Adhesive 1 | 700 | 188 | 25 | 0.54 | 0.07 | 18 | 0.60 |
| Example 3 | Module 1 | Support 1 | Adhesive 2 | 760 | 188 | 50 | 0.49 | 0.13 | 40 | 0.54 |
| Example 4 | Module 1 | Support 2 | Adhesive 1 | 760 | 125 | 50 | 0.33 | 0.20 | 18 | 0.53 |
| Example 5 | Module 3 | Support 3 | Adhesive 1 | 500 | 100 | 65 | 0.40 | 0.33 | 18 | 0.52 |
| Comp. 1 | Module 1 | Support 3 | Adhesive 3 | 760 | 100 | 50 | 0.26 | 0.25 | 4 | 0.42 |
| Comp. 2 | Module 4 | Support 2 | Adhesive 1 | 760 | 125 | 120 | 0.33 | 0.48 | 8 | 0.47 |
| Comp. 3 | Module 4 | Support 4 | Adhesive 4 | 760 | 100 | 120 | 0.26 | 0.60 | 60 | 0.50 | an image receiving layer by use of T dies so as to make a thickness of 40 μm; adhesive 1 was coated on the second support by use of T dies so as to make a thickness of 240 μm; IC module 2 was mounted on the front support provided with the adhesive so as to the circuit plane was on the support 2 side as shown in FIG. 8, and then sandwiched by up and down sheets.; and the resulting configuration was laminated for 1 minute at 70° C. to prepare sheet 2 for an IC card. The sheet after preparation was kept for 7 days under an environment of 25° C. and 50% RH. The card thus prepared had a thickness of 700 μm and a rebound coefficient of 0.60.

Example 3

Example 3 was prepared in a similar manner to example 1, except that as adhesive 2 was used as an adhesive. The card thus prepared had a thickness of 760 μm and a rebound coefficient of 0.54.

Example 4

Example 4 was prepared in a similar manner to example 1, except that "Support 2" was utilized as the first and second supports and sheet 3 for an IC card was prepared as follows.

<Preparation of Sheet 3 for IC Card>

Figure 11:
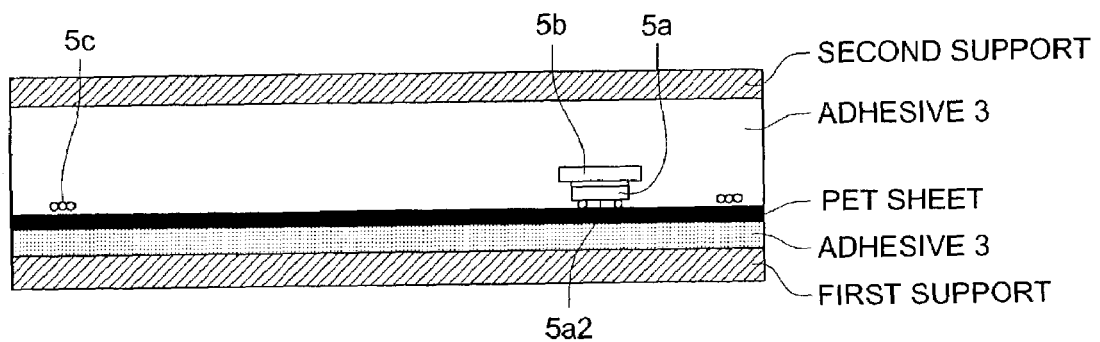
FIG. 11 shows a schematic layer configuration of an IC card.
Figure 12:
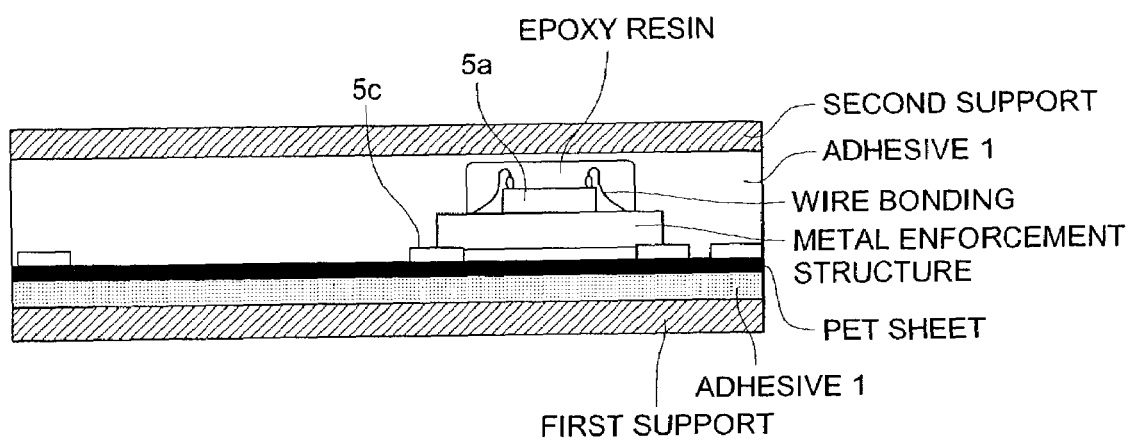
FIG. 12 shows a schematic layer configuration of an IC card.

A card producing apparatus of FIG. 7 was utilized and the above-described second support and the first support having an image receiving layer, which were prepared by use of <Support 2>, are utilized as the first support and the second support. Adhesive 1 was coated on the first support having an image receiving layer by use of T dies so as to make a thickness of 65 μm; adhesive 1 was coated on the second support by use of T dies so as to make a thickness of 400 μm; IC module 1 having a configuration shown in FIG. 4 was mounted on the first support provided with the adhesive so as to the circuit plane was on the first support side as shown in FIG. 11, and then sandwiched by up and down sheets; and the resulting configuration was laminated for 1 minute at 70° C. to prepare sheet 3 for an IC card. The sheet after preparation was kept for 7 days under an environment of 25° C. and 50% RH. The card thus prepared had a thickness of 760 μm and a rebound coefficient of 0.53.

Example 5

Example 5 was prepared in a similar manner to example 1, except that IC module 3 was used as an IC module, "Support 3" was utilized as the supports and sheet 4 for an IC card was prepared as follows.

<Preparation of Sheet 4 for IC Card>

A card producing apparatus of FIG. 7 was utilized and the above-described second support and the first support having an image receiving layer, which were prepared by use of "support 3", are utilized as the first support and the second support. Adhesive 1 was coated on the first support having an image receiving layer by use of T dies so as to make a thickness of 20 μm; adhesive 1 was coated on the second support by use of T dies so as to make a thickness of 220 μm; IC module 3 having a configuration shown in FIG. 4 was mounted on the first support provided with the adhesive so as to the circuit plane was on the front support side as shown in FIG. 11, and then sandwiched by up and down sheets; and the resulting configuration was laminated for 1 minute at 70° C. to prepare sheet 4 for an IC card. The sheet after preparation was kept for 7 days under an environment of 25° C. and 50% RH. The card thus prepared had a thickness of 500 μm and a rebound coefficient of 0.52.

Comparative Example 1

Comparative example 1 was prepared in a similar manner to example 1, except that adhesive 3 was used as an adhesive, "support 3" was utilized as the front and back supports and sheet 5 for an IC card was prepared as follows.

<Preparation of Sheet 5 for IC Card>

A card producing apparatus of FIG. 7 was utilized and the above-described second support and the first support having an image receiving layer, which were prepared by use of "support 3", are utilized as the first support and the second support. Adhesive 3 was coated on the first support having an image receiving layer by use of T dies so as to make a thickness of 80 μm; adhesive 3 was coated on the second support by use of T dies so as to make a thickness of 440 μm; IC module 3 having a configuration shown in FIG. 4 was mounted on the first support provided with the adhesive so as to the circuit plane was on the first support side as shown in FIG. 11, and then sandwiched by up and down sheets; and the resulting configuration was laminated for 1 minute at 70° C. to prepare sheet 5 for an IC card. The sheet after preparation was kept for 7 days under an environment of 25° C. and 50% RH. The card thus prepared had a thickness of 760 μm and a rebound coefficient of 0.42.

Comparative Example 2

Comparative example 2 was prepared in a similar manner to example 1, except that IC module 4 was used as an IC module, "Support 2" was utilized as the supports and sheet 6 for an IC card was prepared as follows.

<Preparation of Sheet 6 for IC Card>

A card producing apparatus of FIG. 7 was utilized and the above-described second support and the first support having an image receiving layer, which were prepared by use of "support 2", are utilized as the first support and the second support. Adhesive 1 was coated on the first support having an image receiving layer by use of T dies so as to make a thickness of 60 μm; adhesive 1 was coated on the second support by use of T dies so as to make a thickness of 430 μm; IC module 4 having a configuration shown in FIG. 5 was mounted on the first support provided with the adhesive so as to the circuit plane was on the second support side as shown in FIG. 11, and then sandwiched by up and down sheets; and the resulting configuration was laminated for 1 minute at 70° C. to prepare sheet 6 for an IC card. The sheet after preparation was kept for 7 days under an environment of 25° C. and 50% RH. The card thus prepared had a thickness of 760 μm and a rebound coefficient of 0.47.

Comparative Example 3

Figure 13:
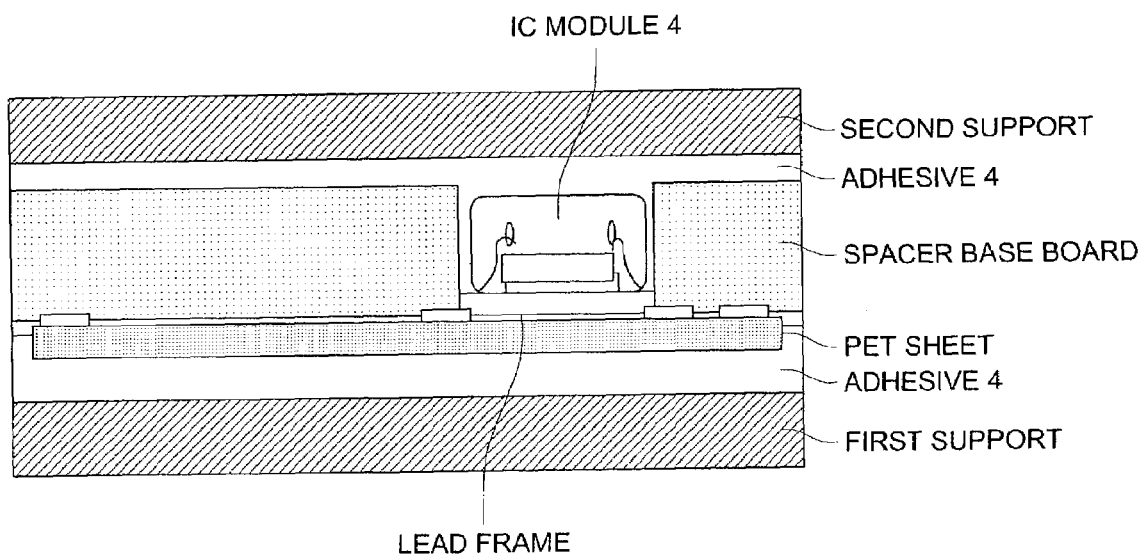
FIG. 13 shows a schematic layer configuration of an IC card.

The first support and the second support were prepared similar manner to example 1 in a sheet form by using "Support 4" as supports. Then, a white polyvinyl chloride sheet having a thickness of 400 μm as a spacer base board was subjected to a process of making a 400 μm diameter hole having the same shape as a convex shape of the IC-tip side of IC module 4. Immediately after being coated with adhesive 4 thereon so as to make a thickness of 100 μm, IC module 4 was mounted, then the second support, immediately after also being coated with adhesive 4 so as to make a thickness of 60 μm, was laminated at 23° C. as shown in FIG. 13. The sheet after preparation was kept for 7 days under an environment of 25° C. and 50% RH. The sheet was stamped to make a card form in a similar manner to example 1.

As described above, according to the invention described in item 1, it is possible to improve impact strength of an IC card and to protect a part including an IC module, by defining a rebound coefficient of an IC card.

According to the invention described in item 2, it is possible to improve impact strength of an IC card and to protect a part including an IC module as well as to improve durability and to improve a surface property in high dimensions, by defining thickness of an IC card in addition to elasticity of an adhesive.

According to the invention described in item 3, it is possible to protect a part including an IC module by constituting a reinforcement structure of a metal reinforcement plate.

According to the invention described in item 4, it is possible to relax stress loaded on an IC-tip and to improve durability by providing an adhesive directly adjacent to a part of the IC-tip.

According to the invention described in item 5, an IC card is possible to be applied to a nonontact-type electronic card or a sheet, which is provided with an image receiving layer and a writing layer and memorizes such as personal information requiring security with respect to prevention of forgery or alternation, to be utilized as a suitable personal certification card.

According to the invention described in item 6, it is possible to relax stress and to obtain high durability due to an adhesive being a reactive-type hot-melt adhesive.

What is claimed is:

1. An integrated circuit (IC) card, comprising:
   a first support;
   a second support;
   an IC module including an IC chip, a reinforcing structural member neighboring to the IC chip and an antenna; the IC module provided between the first and second supports;
   a first adhesive layer provided between the first support and the IC chip; and
   a second adhesive layer provided between the first support and the IC chip,
   wherein the IC card has a rebound coefficient (h/h0) of 0.52 to 0.70, where h0 is a dropping height of 60 cm from which a steel ball made of S45C steel and having a top edge diameter of 20 mm and a weight of 50 g is free dropped onto the IC card and h is a rebound height to which the steel ball rebounds from the IC card which is rigidly fixed on a table having a hole of 27 mm diameter by being sandwiched from upside and downside of the IC card.

2. The IC card of claim 1, wherein an adhesive used for the first and second adhesive layer has a 2% elastic modulus of 5 kg/mm$^2$ to 55 kg/mm$^2$.

3. The IC card of claim 2, wherein the adhesive is a reactive-type hot-melt adhesive.

4. The IC card of claim 1, wherein when the total thickness of the first and second supports is Tsupport and the thickness of the IC card is Tcard, the ratio (Tsupport/Tcard) is 0.33 to 0.55.

5. The IC card of claim 1, wherein when the total thickness of the first and second supports is Tsupport and the thickness of the IC chip is Tchip, the ratio (Tchip/Tsupport) is 0.05 to 0.40.

6. The IC card of claim 1, wherein the thickness of each of the first and second support is 30 $\mu$m to 300 $\mu$m.

7. The IC card of claim 6, wherein the thickness of each of the first and second support is 50 $\mu$m to 200 $\mu$m.

8. The IC card of claim 1, wherein the thickness of each of the first and second adhesive layers is 10 $\mu$m to 600 $\mu$m.

9. The IC card of claim 8, wherein the thickness of each of the first and second adhesive layers is 10 $\mu$m to 500 $\mu$m.

10. The IC card of claim 9, wherein the thickness of each of the first and second adhesive layers is 10 $\mu$m to 450 $\mu$m.

11. The IC card of claim 1, wherein the thickness of the IC chip is 10 $\mu$m to 300 $\mu$m.

12. The IC card of claim 11, wherein the thickness of the IC chip is 30 $\mu$m to 300 $\mu$m.

13. The IC card of claim 12, wherein the thickness of the IC chip is 30 $\mu$m to 250 $\mu$m.

14. The IC card of claim 1, wherein the reinforcing structural member is a metallic reinforcing plate provided through an adhesive in contact with a non-circuit surface of the IC chip.

15. The IC card of claim 1, wherein one of the first and second adhesive layers is arranged to directly neighbor to a part of the IC chip.

16. The IC card of claim 1, wherein one of the first and second supports includes an image receiving layer on which ID information including a name and a facial image is provided and other one of the first and second supports includes a writable layer.

17. The IC card of claim 1, further comprising:
   a cushion layer between an image receiving layer and the IC module.

18. The IC card of claim 17, where the cushion layer is made of a resin.

19. The IC card of claim 1, where the IC card has a thickness of 760 $\mu$m.

* * * * *